United States Patent [19]
Dyer et al.

[11] Patent Number: 5,240,557
[45] Date of Patent: Aug. 31, 1993

[54] SEMICONDUCTOR WAFER STACKING APPARATUS AND METHOD

[75] Inventors: Lawrence D. Dyer, Richardson; Dempsey McGregor; Robert M. Montgomery, both of Sherman; Jerry B. Medders, Van Alstyne, all of Tex.; Michael R. Head, Calbert, Okla.; Tom G. Gullett, Sherman, Tex.

[73] Assignee: Texas Instruments Incorporated, Dallas, Tex.

[21] Appl. No.: 891,536

[22] Filed: Jun. 1, 1992

[51] Int. Cl.⁵ .................... H01L 21/306; B44C 1/22
[52] U.S. Cl. .................. 156/654; 156/345; 156/662; 414/222; 414/589
[58] Field of Search .............. 156/636, 637, 639, 662, 156/903, 345, 654; 414/222, 589, 922, 927, 907

[56] References Cited

U.S. PATENT DOCUMENTS

4,550,239 10/1985 Uehara et al. ............... 156/345 X
4,550,242 10/1985 Uehara et al. ............... 156/345 X Primary Examiner—William A. Powell
Attorney, Agent, or Firm—Richard Donaldson; William E. Hiller; Wade James Brady

[57] ABSTRACT

An apparatus stacks semiconductor wafers and spacers and clamps them in an axial alignment for mounting in a semiconductor wafer edge polishing machine. After edge polishing, the apparatus separates the wafers and spacers and delivers them respectively into separate cassettes for further processing or recycling.

21 Claims, 8 Drawing Sheets

SEMICONDUCTOR WAFER STACKING APPARATUS AND METHOD

FIELD OF THE INVENTION

This invention relates to semiconductor material, and more particularly to an apparatus and method for stacking and aligning, and unstacking semiconductor wafers and spacers from and to cassettes in connection with processing semiconductor wafers.

BACKGROUND OF THE INVENTION

During the manufacture of semiconductor wafers, the edge of the wafer is ground to a rounded or beveled profile by means of an abrasive wheel. The rounded edge reduces chipping during later process steps. The grinding wheel usually contains diamond abrasive ranging in particle size from 30 to 40 micrometers, and leaves a surface that has visible ridges and valleys as seen under a low power microscope. It is known that a smoother edge surface is needed in integrated circuit manufacturing. Smoother edges are needed because wafers with rough edges chip more easily, edge ground wafers contain deeper micro cracks than edge polished wafers, and edge ground wafers contain depressions that may be a source of particles in processes that use phosphorous glasses. Edge ground wafers sometimes cause photoresist to form "beaded" edges, i.e. photoresist does not spin correctly to make a uniform layer at the edge of the wafer, but makes an irregular thickened bead around the wafer edge. The beaded edge causes problems such as particle formation.

Present polishing processes include mechanically abrading wafers with a finer abrasive, dipping the wafer in an acid polishing mixture, treating the wafer edges with an acid polishing mixture, or by dripping or spraying an etchant onto the edge. Mechanical abrasion has the disadvantage that it does not produce a mirror finish. Dipping the entire wafer in acid leads to the rounding of the planar surfaces of the wafer unless extreme care is exercised in the process. Acid etching of the edge requires considerable removal of material for etching a smooth surface, which causes a problem with maintaining an optimum profile for the wafer.

Individual processing of single wafers is time consuming and costly. Some edge polishers carry wafers between threaded shafts, but these wafers have to be individually loaded and unloaded.

BRIEF SUMMARY OF THE INVENTION

The invention is an apparatus and method for stacking, aligning, and mounting semiconductor wafers prior to mounting the stacked wafers for polishing the edges of the wafers. A plurality of wafers alternating with spacers are assembled from wafer cassettes.

A plurality of wafers are loaded, from a wafer cassette, in to an integrator. The wafers are held in the integrator spaced apart from each other, leaving sufficient space for a spacer.

A second cassette holding spacers is then placed adjacent the integrator, and the spacers moved into the integrator such that one spacer is placed between adjacent wafers.

The alternating spacers and wafers are moved out of the integrator to an alignment tower where an axial clamp holds the wafers/spacers together in axial alignment with the wafer surface perpendicular to the axis. The wafers/spacers are removed from the alignment tower, still clamped together and placed in a polishing machine.

After the stack of wafers has finished its cycle in the edge polish apparatus, the stack is unloaded and the wafers separated from the spacers in one of two different ways.

(1) The stack of wafers/spacers is first pushed unto a separation box (de-integrator). The wafers are next blocked from forward movement by a pinning bar, then the spacers are pushed by a series of rods into their cassette for rinsing, drying and reuse. The stacked wafers and separation box are tilted onto a tank of water and the pinning bar retracted; the wafers are thereby allowed to fall into a waiting cassette for spin rinse, drying and further processing.

(2) The stack of wafers/spacers is pushed into a separation box. The separation box is tilted into a tank of water such that the wafer and spacer are essentially vertical. A pinning bar keeps the wafers from falling, but the spacers fall into a waiting spacer cassette. Next, the spacer cassette is moved out of the way, and a wafer cassette is moved into the receiving position. The pinning bar is extracted and the wafers fall into the cassette for further processing.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
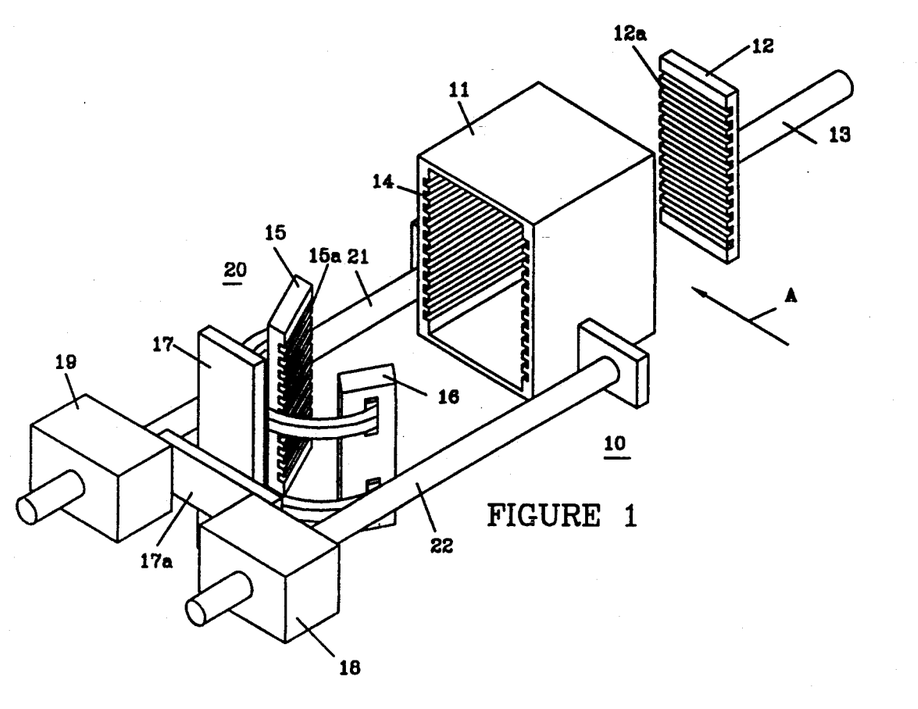
FIG. 1 is simplified pictorial drawing of the wafer/spacer assembly apparatus.

FIG. 1 is a simplified drawing of the wafer/spacer assembly apparatus 10. An integrator 11 is used to assemble a stack of wafers separated by spacers. A wafer cassette (not illustrated) is placed between load plate 12 and integrator 11. The cassette is moved between the integrator 11 and load plate 12 as indicated by arrow A. As load plate 12 is moved into the wafer cassette by push rod 13, semiconductor wafers are moved into the slots 14 of integrator 11.

After the wafers are loaded into integrator 11, a spacer cassette is moved between integrator 11 and load plate 12, and are loaded in to integrator 11 by moving load plate 12 into the spacer cassette and pushing the spacers such that there is a spacer on each side of each wafer.

After the wafers and spacers are loaded into integrator 11, alignment tower 20 is moved adjacent to integrator 11. Alignment tower 20 has at least one slotted plate. Two slotted plates 15 and 16 (illustrated in FIG. 1) have slots 15a which correspond to the slots 14 in integrator 11. Slots 15a engage the edges of the wafers, aligning them, and the spacers holding the wafers in a spaced relationship. Slotted plates 15 and 16 are mounted on plate 17 which is attached by plate 17a to two blocks 17 and 18, which are slidably mounted on slide tracks 21 and 22.

Figure 2:
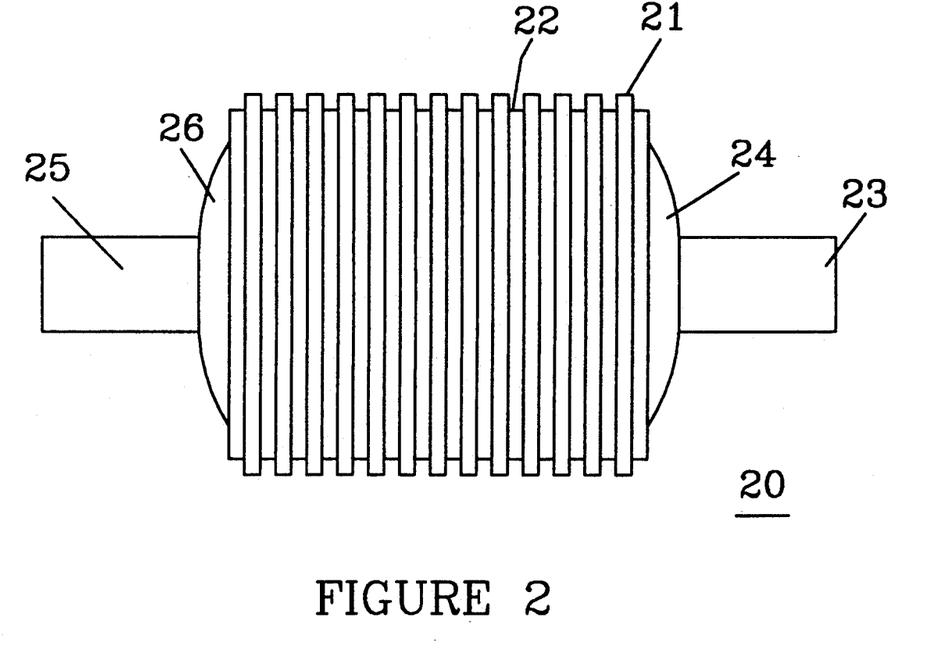
FIG. 2 illustrates axially aligned wafers/spacers between mounting shafts.

The wafers and spacers are held in slotted plates 15 and 16 and then are clamped together as illustrated in FIG. 2. FIG. 2 shows wafers 21 and spacers 22 clamped together between plates 24 and 26 and mounting shafts 23 and 25. The wafers 21 and spacers 22, clamped together, are ready to be placed in the polishing apparatus.

Figure 3:
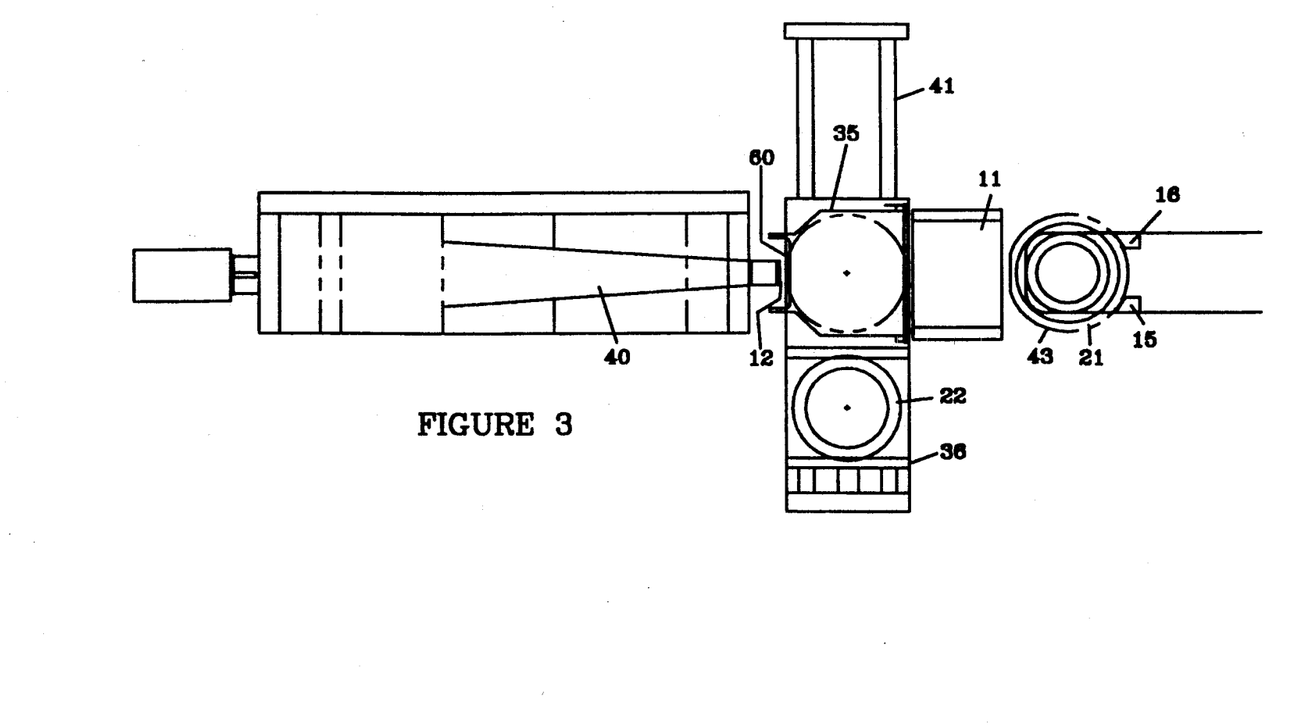
FIG. 3 is top of the wafer/spacer assembly apparatus.

FIG. 3 is a top view of the wafer/spacer assembly apparatus. A wafer cassette 35 is shown in position between load plate 12 and integrator 11. Pusher 40 moves wafers from cassette 35 into integrator 11. Load shuttle 41 then removes the wafer cassette and moves spacer cassette 36 into position. Pusher 40 moves spacers 22 from cassette 36 into integrator 11. Pusher 40 and plate 12 then moves the wafer/spacer stack 43 into a clamping position against alignment towers 15,16. The wafers/spacers are clamped together by axial clamp 23,25 (FIG. 4) so that they can be loaded into a polishing apparatus.

Figure 4:
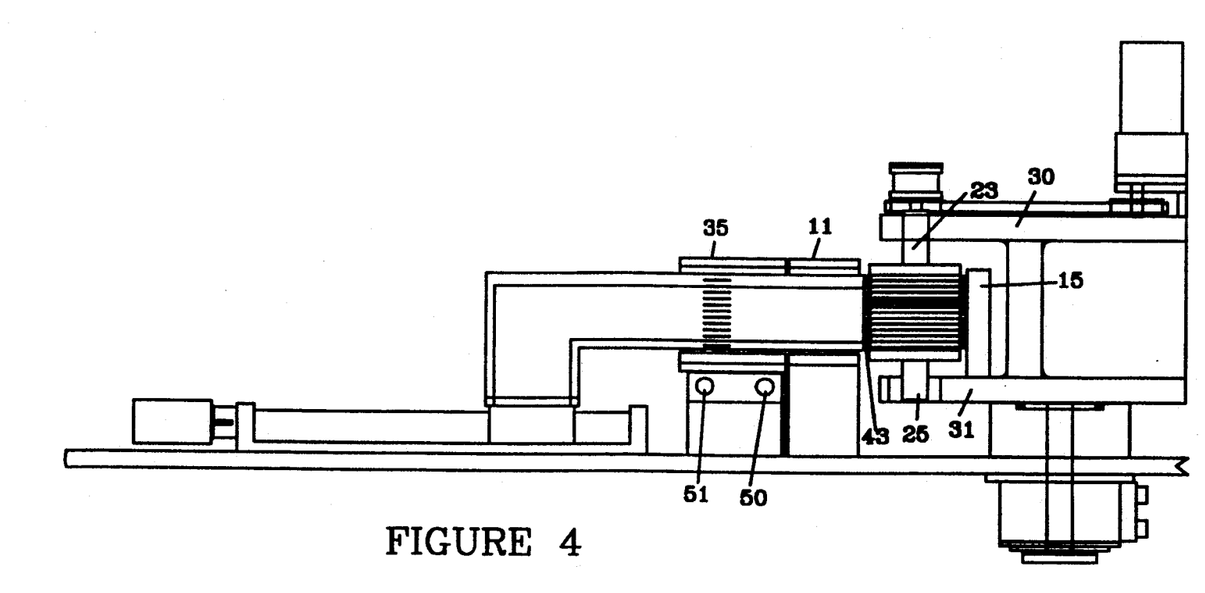
FIG. 4 is a partial side view of the wafer/spacer assembly apparatus.

FIG. 4 is a side view of the wafer/spacer assembly apparatus as illustrated in FIG. 3. The clamp assembly is shown in more detail. Clamps 23 and 25 are supported by holder arms 30 and 31. Load plate 12 and alignment towers 15 and 16 hold the wafers/spacers together and clamped between axial clamp members 23 and 25.

Shuttle 41 (FIG. 3) moves on tracks 50, 51 to move the wafer cassettes and spacer cassettes into and out of position to load the wafers and spacers into the integrator.

The semiconductors are loaded into cassettes and load plate 12 pushes against the flat side of the wafers. The spacers have a diameter such that when the wafers and spacers are pushed into the alignment towers 15,16, the spacers and wafers are aligned axially before being clamped together. If the wafers have a flat region on their edges, then the flat areas are aligned.

Figure 4A:
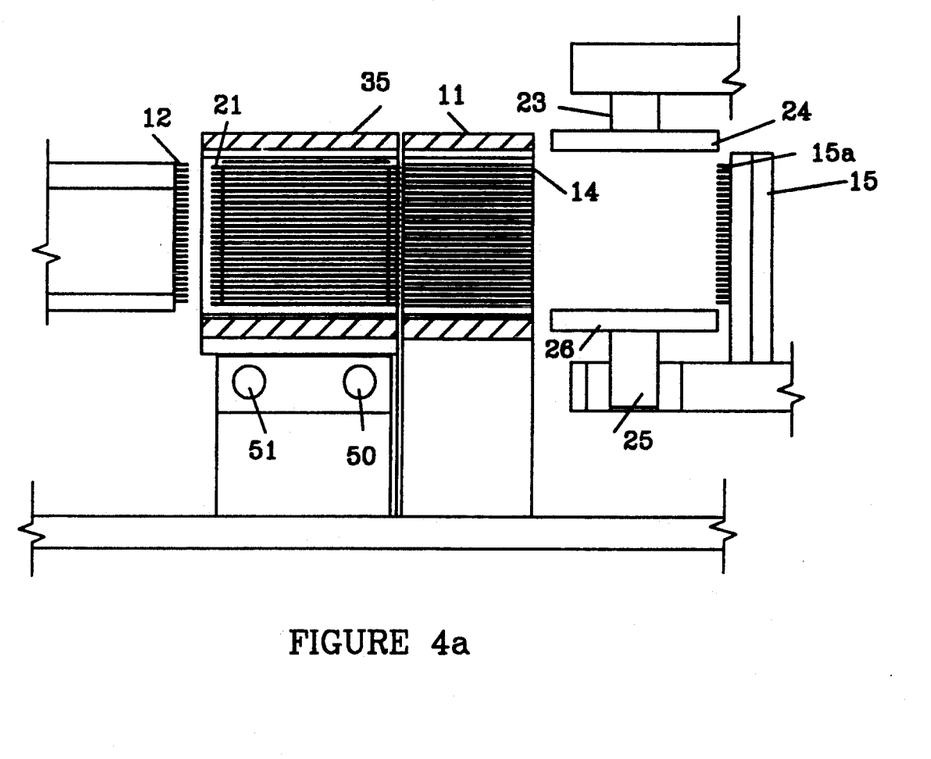
FIG. 4a is a partial view of the apparatus in FIG. 4.

FIG. 4a is a partial view of the apparatus in FIG. 4. A wafer cassette 35, loaded with wafers 21, is moved to a position between load plate 12 and integrator 11. Load plate 12 moves wafers 21 into slots 14 in integrator 11. After the wafers placed into slots 14, and the spacers are in place on each side of the wafers, load plate 12 moves the stacked wafers/spacers out of integrator 11 onto the slots 23 in alignment towers 15, 16. If the wafers have orientation flats, the load plate pushes on the flats. Otherwise, the load plate pushes a round edge of the wafers. The dimensions of the spacers are such that when the wafers are in slots 23 in the alignment tower plates 15 and 16, the wafers and spacers are axially aligned and ready to be clamped together between clamp plates 24 and 26.

Figure 4B:
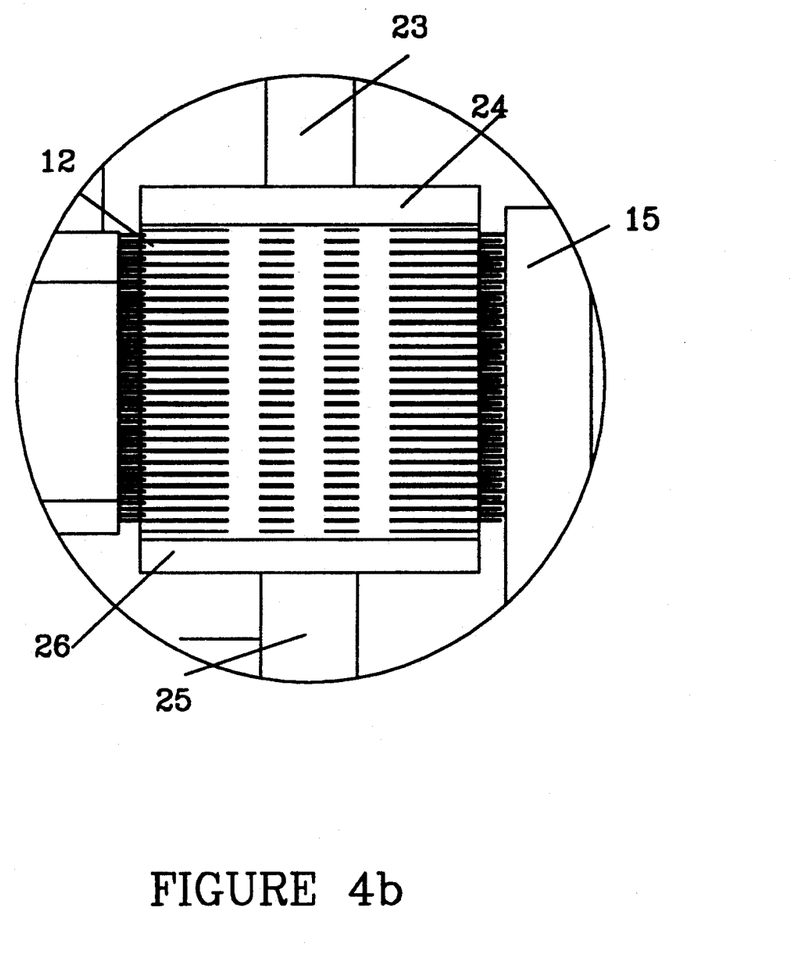
FIG. 4b is an enlarged view of the clamped wafers after they are aligned and clamped together.

FIG. 4b is an enlarged view of the clamped wafers after they are aligned and clamped together. The wafers resided in the slots in the alignment towers 15 and 16 (only 15 illustrated) and the slots in load plate 12. After clamping, the wafers are ready for processing.

Figure 5:
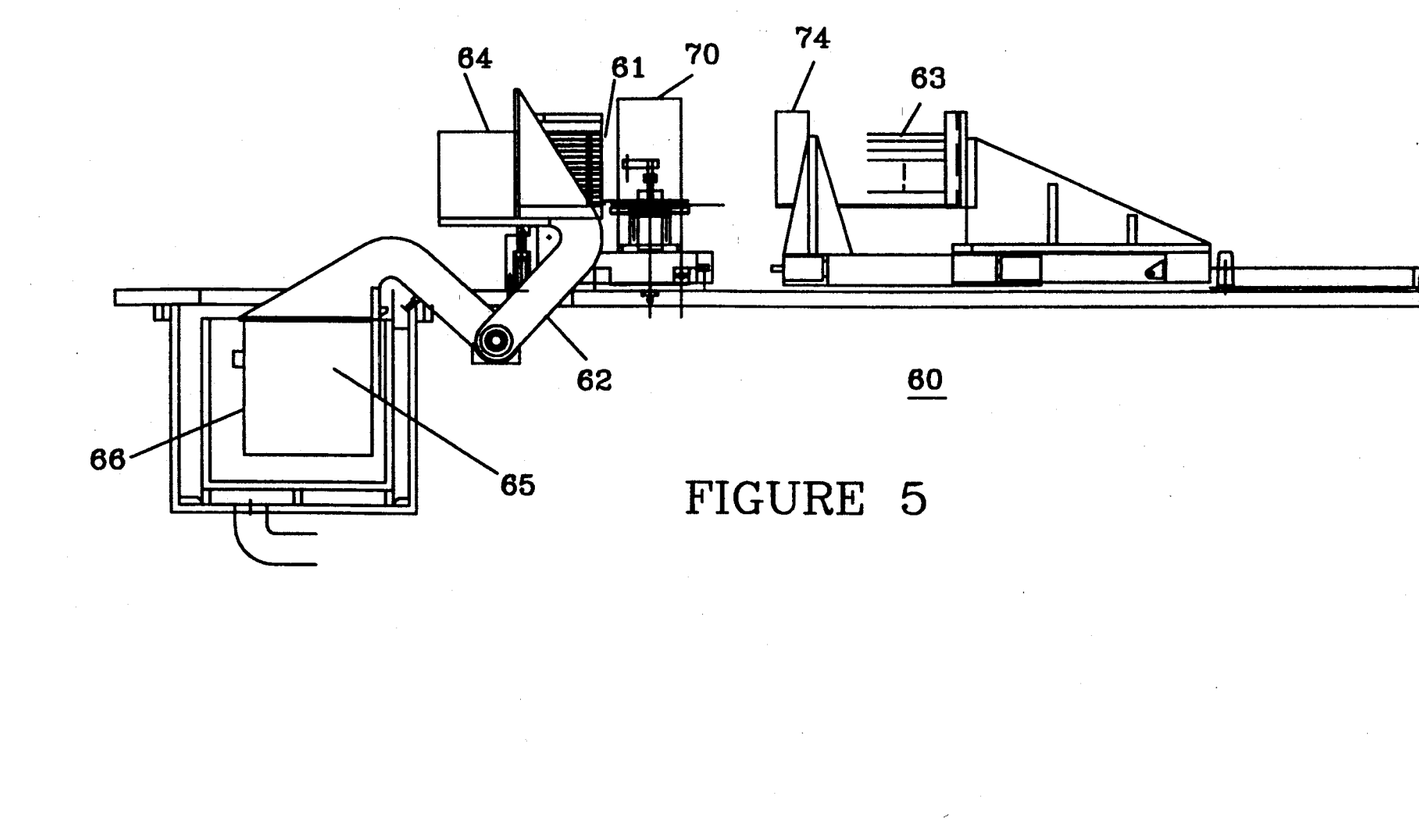
FIG. 5 is front view of an apparatus of the present invention illustrating a wafer/spacer de-integrator.

FIG. 5 is an embodiment of the invention including apparatus for separating the wafers and spacers after polishing the wafers. Apparatus 60 includes stacked wafers/spacers 61. A spacer cassette 64 is located adjacent the wafer spacer/stack. A wafer pinning assembly (not illustrated) is positioned between the wafers and the spacer cassette. A push rod assembly 63 is moved forward toward the wafer/spacer stack and moves the spacers into the spacer cassette. The pinning assembly prevents the wafers from moving into the spacer cassette. After the spacers are loaded into the spacer cassette, the cassette is removed, and the wafer stack is tilted, by tilt arm 62, into water tank 65. A wafer cassette 66, in water tank 65, is positioned such that the wafers will fall into the cassette when the wafers are tilted into the tank by tilt arm 62. The wafer pinning rods, not illustrated, are removed after the wafers are tilted into the tank so that the wafers are free to fall into the cassette.

Figure 6:
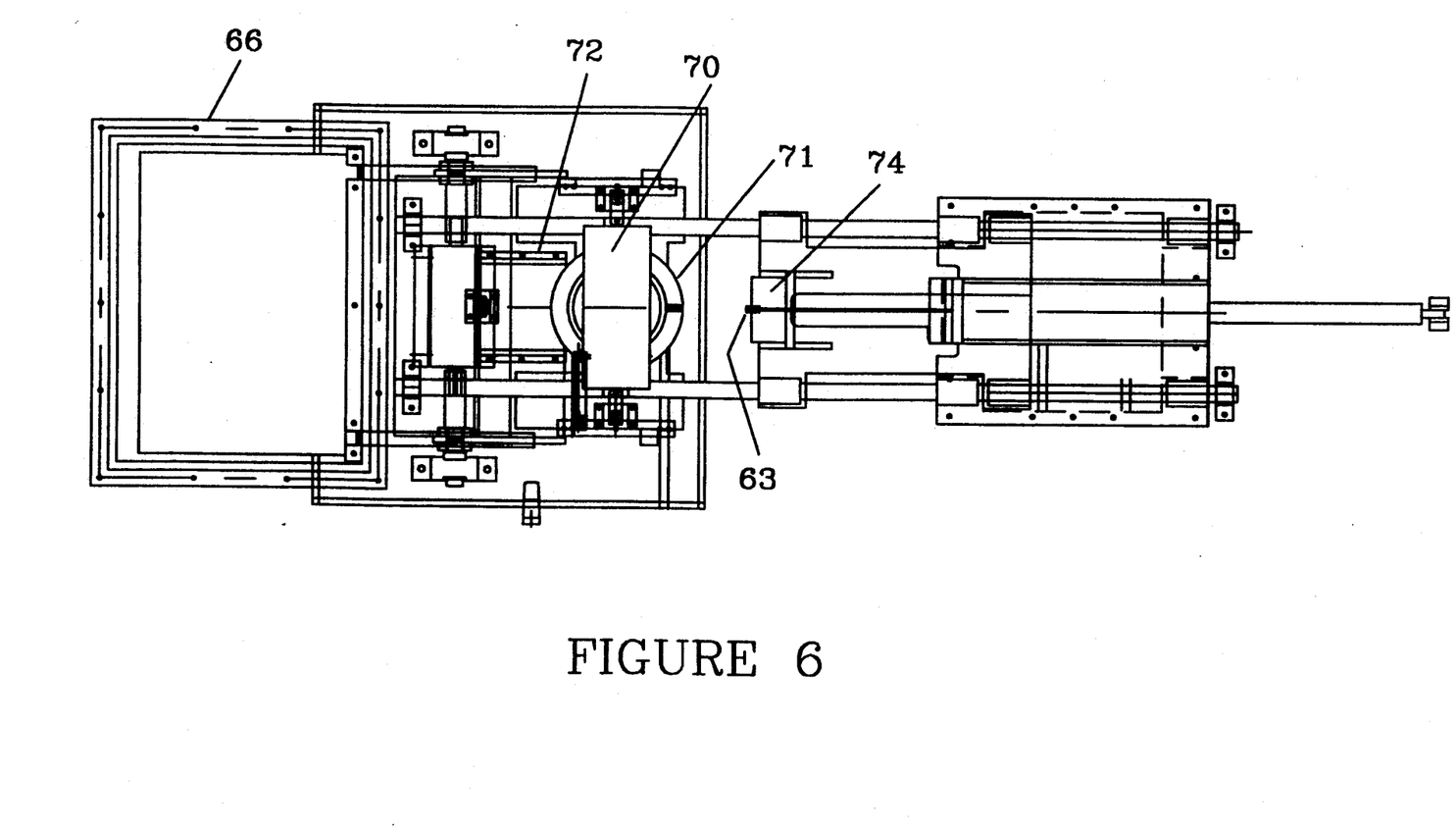
FIG. 6 is a top view of another embodiment of the invention having a de-integrator.

In the embodiment of FIG. 6, the stacked wafers/spacers 71 are pushed into a separation box 72 by push rods 73. Separation box 72 is tilted into tank of water 74 such that the wafers and spacers are essentially vertical. A pinning bar (not illustrated) keeps the wafers from falling, but the spacers fall in to a spacer cassette. The spacer cassette is moved and a wafer cassette is move into a receiving position. The pinning bar is retracted and the wafers fall into the cassette for further processing.

What is claimed:

1. An apparatus for loading from cassettes and alternately stacking, aligning, and clamping semiconductor wafers and spacers for processing the wafers, comprising:
   an integrator for holding alternate wafer/spacers;
   a load plate for moving the wafers and spacers from the cassettes into the integrator;
   at least one alignment tower adjacent the integrator for receiving the edges of the wafers as moved into the alignment tower by the load plate; and
   a clamp assembly for axially clamping the aligned and alternately stacked wafers and spacers.

2. The apparatus according to claim 1, including a shuttle for alternately moving wafer cassettes and spacer cassettes between the integrator and load plate for loading the wafers and spacers into the integrator.

3. The apparatus according to claim 1, wherein said at least one alignment tower is movable to position the tower adjacent the integrator.

4. The apparatus according to claim 1 wherein the load plate has a flat surface divided into grooves and ridges spaced to correspond to the edges of wafers and spacers as positioned in the load cassettes.

5. The apparatus according to claim 1, wherein said integrator has grooves in opposite sides corresponding to the edges of the wafers and spacers as positioned in the load cassettes.

6. The apparatus according to claim 1, where said alignment towers each have grooves in its face corresponding to the edges of the wafers and spacers positioned in the load cassettes.

7. The apparatus according to claim 1, including a deintegrator apparatus for separating the wafers and spacers into different cassettes.

8. The apparatus according to claim 7, including a tilting apparatus for loading the wafers into a cassette.

9. The apparatus according to claim 1, including a water tank and a cassette into which the wafers are loaded after polishing.

10. An apparatus for loading from cassettes and alternately stacking and clamping semiconductor wafers and spacers for edge polishing the wafers, comprising:
   an integrator for holding alternate wafer/spacers;
   a grooved load plate for pushing against the edges of the wafers and spacers and moving the wafers and spacers from cassettes into the integrator;
   at least one alignment tower adjacent the integrator for receiving the edges of the wafers and spacers as moved into the alignment tower by the load plate; and
   a clamping device for axially clamping the aligned and alternately stacked wafers and spacers.

11. The apparatus according to claim 10, wherein said integrator has grooves in opposite sides corresponding to the edges of the wafers and spacers as positioned in the load cassettes.

12. The apparatus according to claim 10, where said alignment towers each have grooves in its face corresponding to the edges of the wafers and spacers as positioned in the load cassettes.

13. An apparatus for loading from cassettes and alternately stacking and clamping semiconductor wafers and spacers for edge polishing the wafers, comprising:
   an integrator for holding alternate wafer/spacers;
   a load plate for moving the wafers and spacers from the cassettes into the integrator;
   a pair of alignment towers adjacent the integrator for receiving the edges of the wafers and spacers as moved into the alignment towers by the load plate;
   a clamp assembly for axially clamping the aligned and alternately stacked wafers and spacers; and
   a de-integrator apparatus for separating the wafers and spacers into different cassettes.

14. The apparatus according to claim 1, wherein a push rod assembly is used to move the wafers and spacers from the cassettes into the integrator.

15. The apparatus according to claim 2, wherein a rotary cassette holder is used for wafers and spacers.

16. The apparatus according to claim 10, wherein a push rod assembly is used for pushing against the edges of the wafers and spacers.

17. A method for stacking and axially aligning semiconductor wafers and spacers between clamp plates, prior to mounting in a polishing machine, comprising the steps of:
   mounting semiconductor wafers in slots in an integrator;
   mounting spacers on each side of the wafers in the integrator;
   moving the wafer and spacers edges into an alignment tower with a load plate to axially align the wafers and spacers; and clamping the axially aligned wafers and spacers with clamping plates.

18. The method according to claim 17, including the steps of alternately moving cassettes holding wafers and spacers adjacent the integrator holder to load the wafers and spacers in the integrator.

19. The method according to claim 17, including the step of pushing on the edge of the semiconductor wafer to move the wafer from the cassette, and from the integrator to the alignment tower.

20. The method according to claim 17, including the steps of:
   edge polishing the stacked and aligned semiconductor wafers;
   separating the semiconductor wafers from the spacers;
   loading the spacers into a first cassette; and
   loading the wafers into a second cassette.

21. The method according to claim 19, including the step of pushing on the flat orientation edge of the semiconductor wafer to move the wafer from the cassette, and from the integrator to the alignment tower.

* * * * *